358-190
8/9/77    XR    4,041,357

United States Patent [19]
Clark, Jr.

[11] 4,041,357
[45] Aug. 9, 1977

[54] HIGH VOLTAGE PROTECTION CIRCUIT

[75] Inventor: Charles Albert Clark, Jr., Chatsworth, Calif.

[73] Assignee: RCA Corporation, New York, N.Y.

[21] Appl. No.: 688,587

[22] Filed: May 21, 1976

[51] Int. Cl.² .............................................. H02H 3/00
[52] U.S. Cl. ...................... 361/6; 358/190; 315/127; 328/9; 325/362; 361/8
[58] Field of Search ............ 317/16, 31, 51, 61, 317/61.5; 178/7.5 R, 7.5 D, DIG. 11; 328/7, 8, 9; 315/127, 119; 321/11, 14, 15; 340/240, 27 AT

[56] References Cited
U.S. PATENT DOCUMENTS

| 2,352,411 | 6/1944 | Sandretto | 317/2 D |
| 2,762,993 | 9/1956 | Sedgfield | 340/27 AT |
| 3,267,321 | 8/1966 | Gessford, Sr. | 328/8 X |
| 3,546,536 | 12/1970 | Umin | 317/31 |
| 3,965,393 | 6/1976 | Chamberlain | 317/31 X |

Primary Examiner—J D Miller
Assistant Examiner—Patrick R. Salce
Attorney, Agent, or Firm—H. Christoffersen; Joseph D. Lazar; Raymond E. Smiley

[57] ABSTRACT

Equipment operating at high voltage which is subject to damaging voltage breakdown at relatively high altitudes and therefore relatively low pressures has a pressure sensitive switch such as a spark gap included in the high voltage circuit in shunting relationship. At lower altitudes no voltage breakdown occurs across the spark gap and the high voltage circuit operates normally. At high altitude voltage breakdown occurs across the spark gap shunting potentially harmful voltages from the high voltage equipment.

7 Claims, 3 Drawing Figures

HIGH VOLTAGE PROTECTION CIRCUIT

BACKGROUND OF THE INVENTION

Any circuit operating at high voltage is subject to voltage breakdown at higher elevations (lower atmospheric pressure conditions). Such voltage breakdown is often harmful to the equipment involved. One solution to the problem is to use sufficiently higher quality components so that either breakdown does not occur at elevations of interest or that such breakdown causes no harm. In some situations equipment need not operate at higher altitudes, but need only "survive".

An airborne weather radar is an example of such equipment. Specifications require that it must operate at relatively lower altitude after being on, but not necessarily operational, at higher altitude. It is becoming common to utilize ordinary television sets as the display portion of the radar. A television set contains a high voltage flyback transformer which is subject to damage at high altitudes (low pressure) conditions.

SUMMARY OF THE INVENTION

An improved high voltage power supply is described having high impedance output terminals across which is impressed a high voltage, which comprises a normally open switch means in shunting relationship with the terminals, and means responsive to a change in an environmental parameter beyond some given amount for closing the switch to thereby reduce the high voltage.

DETAILED DESCRIPTION

Figure 1:
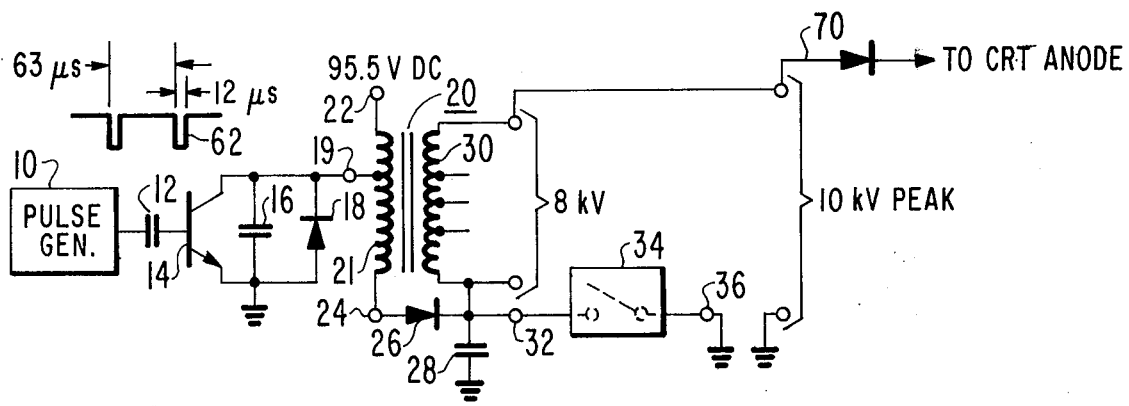
FIG. 1 is a circuit in electrical schematic form of one embodiment of the invention.

Referring to FIG. 1, the pertinent portion of a high voltage circuit in a standard television set is illustrated for purposes of showing an exemplary embodiment of the invention. A pulse source 10 is coupled via a suitable coupling capacitor 12 to the base of a switching transistor 14. Pulse source 10 is the line (TV horizontal) oscillator, producing pulses at a 15.75 kHz rate. The pulses are of a polarity such that transistor 14 is capable of conducting most of the 63.5 microsecond cycle and rendered non-conducting only about 12 or 13 microseconds of each cycle.

A ringing capacitor 16 and flyback diode 18 are coupled in parallel between the collector and emitter of transistor 14. The emitter of transistor 14 is coupled to a source of reference potential such as ground, while the collector is coupled to the center tap 19 of the primary winding 21 of a flyback transformer 20. The value of capacitor 16 and the inductance value of primary winding 21 are such that they resonate and complete a half cycle of ring within the time that transistor 14 is forced off, as is known to those familiar with the television art. Also in general the transformer has a sufficiently low resistance so that a high Q circuit is created.

Transformer 20 is a horizontal deflection flyback transformer of the type conventionally found in standard television receivers. Such flyback transformers as used in standard television receivers are of the resonating type and typically have the output winding tuned to three times the ring frequency of capacitor 16 and primary 21, whereby the transformer is typically capable of producing voltages across their secondary on the order of several thousand volts. Such transformers are generally constructed of comparatively inexpensive materials which perform satisfactorily at near sea level altitudes. However at altitudes on the order of 12 kilometers to which a television receiver is tested to meet governmental requirements when utilized as a weather radar display, damaging voltage breakdown of the flyback transformer can occur.

Figure 2:
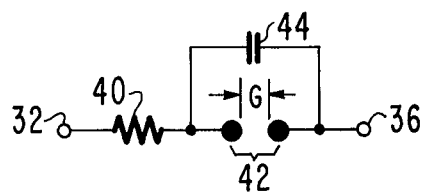
FIG. 2 is a specific embodiment of an atmospheric parameter detection switch useful in practicing the invention.

One end terminal 22 of transformer 20 is coupled to a source of 95.5 volts dc, while the other end terminal 24 is coupled to the anode of a rectifying diode 26. The cathode of rectifying diode 26 is coupled to a filter capacitor 28, to one end of secondary winding 30 of transformer 20 and to an input terminal 32 of an environmental parameter switch 34 such as one which is pressure sensing. The output terminal 36 of switch 34 is coupled to a source of reference potential such as ground. Although switch 34 is illustrated as a mechanical switch in FIG. 1, it may take many forms including an anneroid barometer switch set to operate (close) above some given altitude and therefore at some given lowered pressure. The switch may also take the form of the device illustrated in FIG. 2 to which attention is now directed.

Input terminal 32 is coupled to a dissipating resistor 40. The other terminal of resistor 40 is coupled to one terminal of a device 42 having a spark gap and to a filter capacitor 44. The remaining terminal of device 42 and of capacitor 44 are coupled via a terminal 36 to ground. The actual gap dimension, G, is set to fire at some relatively lower pressure such as that associated with about 9 kilometers altitude above means sea level under standard humidity conditions.

Figure 3:
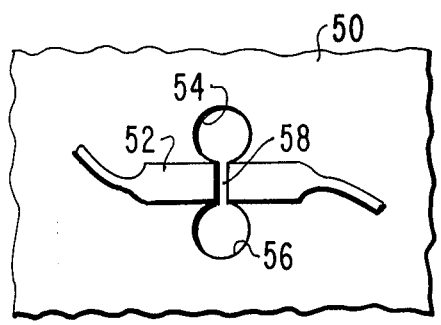
FIG. 3 is a spark gap adapted to printed circuit board fabrication techniques.

A spark gap may be easily fabricated on a printed circuit board as illustrated in FIG. 3 to which attention is now directed. Legend 50 represents a broken away portion of a standard printed circuit board on which are a plurality of circuit paths (not illustrated) and a plurality of components (not illustrated) including resistor 40 and filter capacitor 44. The spark gap is created as follows. First the printed circuit board with all its copper paths is created in a conventional manner including, coextensively located on both top and bottom surfaces of board 50, a rectangular pad of copper. For the voltages and altitudes for the exemplary working embodiment, pads (one, 52, being shown) approximately 2.5 centimeters by 0.6 centimeters are created. Then apertures 54, 56 are drilled (or created by other means) through the printed circuit board 50 adjacent the length dimension of copper pads 52 at the mid point thereof. Finally a milling machine or similar device with an appropriate routing bit is lowered into one of the holes 54, 56 and a slot 58 is created between the holes. The holes are of sufficient size to prevent a creep voltage path. Creep breakdown voltage along a surface is lower (by a factor of approximately 3 to 1) than is breakdown voltage in absence of a (printed circuit board) surface. Holes 54, 56 have circumference large enough to prevent creep breakdown not controlled by slot 58. In one example system, holes approximately one centimeter in diameter and a slot approximately 0.13 centimeters are chosen.

Operation of the circuit of FIG. 1 will be described assuming the radar is initially at a relatively low altitude and therefore relatively high pressure situation. Pulse generator 10 produces pulses such that transistor 14 or diode 18 are conducting most of the pulse cycle and such that center tap 19 is at essentially ground most of the pulse cycle. When a negative going pulse such as 62 occurs, the transistor 14 is rendered non-conducting and transformer primary 21 which has current flowing out of terminal 19 of transformer 20 rings with capacitor 16. As a result the capacitor is charged to a peak voltage differential of about 1100 volts between terminal 19 and ground. Since primary terminal 22 is at approximately 100 volts (95.5V), a voltage of approximately 1000V peak is impressed between terminals 22 and 19. Since terminal 19 is the center tap of the transformer primary, terminal 24 is forced by transformer action to approximately 2000 volts peak.

Although the operation of transformer 20 is complex, it can be assumed for purposes of this discussion that transformer 20 has a 4:1 step up ratio from primary (terminals 22, 24) to secondary. Therefore the secondary winding 30 provides an 8000 volts peak signal across its output terminals as indicated in FIG. 1. Meanwhile the approximately 2000 volts peak voltage at terminal 24 is rectified by diode 26 and impressed on capacitor 28 which maintains a boost level of 2000 volts. Due to the interconnection between the secondary winding 30 and capacitor 28 a 10,000 volt peak voltage is available as indicated in FIG. 1 (2000 volts dc + 8000 volts peak ac) and is applied to a high voltage rectifier 70 and then to the anode of a television display tube (not shown).

At higher elevations (lower pressure), the same actions occur except that damaging high voltage arcing occurs in transformer 20 and perhaps at other high voltage components (for example the high voltage rectifier 70). In FIG. 1 at lower pressure conditions switch 34 closes automatically shunting capacitor 28 thereby reducing its voltage to 0 or near 0 volts. Furthermore the Q at the transformer is lowered causing the 8000 volt output to drop to approximately 6000 volts. By appropriate choice of components, the high voltage is in this way lowered to eliminate damage due to corona discharge and subsequent arcing at high voltages. Although a variety of switches 34 may be used, the spark gap circuit of FIG. 2 has been found to be economical to construct and to perform satisfactorily. The gap being open to the atmosphere fires at about 9 or 10 kilometers acting itself as a short circuit and therefore placing resistor 40 across capacitor 28. At frequencies of interest resistor 40, which in one working embodiment is 68 kohms, effectively discharges capacitor 28 which in the same working embodiment is 0.0062 µf. The additional shunt resistance 40 in the circuit also alters the Q of the circuit altering the voltage across transformer winding 30.

Capacitor 44 which plays no part in firing of gap 42 is required for extinguishing the spark when the weather radar is once again at a lower altitude. This follows since alternating current pulses are continuously applied to terminal 32 which, in the absence of filter capacitor 44, would continue the spark on gap 42 even at sea level.

It will be understood that at higher altitudes where the voltage is lowered by means of the device just described, the television display tube (not shown) to which the power supply is connected may not produce a satisfactory picture. The only requirement at the higher altitudes is that the display device be on and that no damage of components occur. No requirement exists for the display to function at the higher altitudes. It need only survive at such altitudes and return to normal operation at lower altitudes.

It should be noted that spark gap 42 is also sensitive to humidity of the air. Thus under high humidity conditions where damaging voltage breakdown of transformer 20 may also occur, gap 42 is also conditioned to fire to conduction. In the environment to which weather radars are normally subject humidity is generally constant so that the spark gap is sensitive only to atmospheric pressure but the gap length G may be defined with due consideration to changes in humidity and atmospheric pressure which cause damaging arc-over. It will also be understood to those familiar in the art that a weather radar is only one of many embodiments in which the invention may be practiced and that the placement of the pressure or humidity (environmentally sensitive) device will depend on the nature of the high voltage supply and the circuit to be protected.

What is claimed is:
1. In a high voltage power supply having high impedance output terminals across which is impressed a high voltage, the improvement for controlling the output voltage of said power supply comprising;
   normally open switch means in shunting relationship with said terminals; and
   means responsive to a change beyond some given amount in an environmental parameter for closing said switch to reduce said high voltage.
2. In a high voltage power supply having high impedance output terminals across which is impressed a high voltage, the improvement for controlling the output voltage of said power supply comprising;
   normally open switch means in shunting relationship with said terminals; and
   means responsive to an atmospheric pressure of less than a given value for closing said switch to reduce said high voltage.
3. In a high voltage power supply having high impedance output terminals across which is impressed a high voltage, the improvement for controlling the output voltage of said power supply comprising;
   normally open switch means in shunting relationship with said terminals; and
   means responsive to a relative humidity of greater than a given value for closing said switch to reduce said high voltage.
4. The combination of claim 1 where said switch comprises two anodes in opposing relationship between which is a gap forming, when considering the voltage of the high voltage supply, a spark gap.
5. The combination as set forth in claim 1 wherein said high voltage power supply produces a high voltage having an alternating current component and further including across said spark gap anodes filter capacitor means for extinguishing said spark when said environmental parameter changes back to less than said given amount.
6. The combination as set forth in claim 4 wherein said anodes and gap are created in a printed circuit board.
7. In a high voltage power supply of the tuned transformer type comprising a transformer, a driving circuit coupled to said transformer for supplying input power thereto and a capacitor coupled in circuit with said transformer for tuning said transformer, said capacitor and transformer having normally a given circuit Q, the improvement for controlling the output voltage of said power supply, comprising:

first means for dissipating energy;

normally open switch means for coupling said first means in circuit with said capacitor and transformer; and means responsive to an atmospheric pressure of less than a given value for closing said switch means thereby causing energy to be dissipated to reduce said circuit Q and said output voltage.

* * * * *